(12) United States Patent
Meiser et al.

(10) Patent No.: US 9,129,820 B2
(45) Date of Patent: Sep. 8, 2015

(54) INTEGRATED CIRCUIT AND METHOD OF MANUFACTURING AN INTEGRATED CIRCUIT

(71) Applicant: Infineon Technologies AG, Neubiberg (DE)

(72) Inventors: Andreas Meiser, Sauerlach (DE); Markus Zundel, Egmating (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/951,099

(22) Filed: Jul. 25, 2013

(65) Prior Publication Data

US 2015/0028408 A1   Jan. 29, 2015

(51) Int. Cl.
  H01L 21/00   (2006.01)
  H01L 27/06   (2006.01)
  H01L 49/02   (2006.01)

(52) U.S. Cl.
  CPC ............ H01L 27/0629 (2013.01); H01L 28/40 (2013.01)

(58) Field of Classification Search
  CPC ...................... H01L 27/10876; H01L 27/0629; H01L 21/8234
  USPC ........... 257/301–303, 306, 330; 438/243–249
  See application file for complete search history.

(56) References Cited

U.S. PATENT DOCUMENTS

| | | | |
|---|---|---|---|
| 6,274,905 B1 * | 8/2001 | Mo | 257/330 |
| 6,518,129 B2 * | 2/2003 | Hueting et al. | 438/270 |
| 8,609,486 B1 * | 12/2013 | Smeys et al. | 438/243 |
| 2007/0026632 A1 * | 2/2007 | Yamamoto | 438/424 |
| 2007/0215920 A1 | 9/2007 | Zundel et al. | |
| 2009/0108403 A1 * | 4/2009 | Gogoi | 257/532 |
| 2009/0321804 A1 * | 12/2009 | Mauder et al. | 257/300 |
| 2011/0163366 A1 | 7/2011 | Zundel et al. | |
| 2011/0165755 A1 | 7/2011 | Zundel et al. | |
| 2013/0075814 A1 | 3/2013 | Meiser et al. | |
| 2013/0299996 A1 * | 11/2013 | Grivna | 257/774 |
| 2014/0167069 A1 * | 6/2014 | Vielemeyer et al. | 257/77 |

FOREIGN PATENT DOCUMENTS

DE   102007010884 B4   10/2010

OTHER PUBLICATIONS

Meiser, A., et al., "Trench Electrode Arrangement." U.S. Appl. No. 13/850,037, filed Mar. 25, 2013.

* cited by examiner

Primary Examiner — Charles Garber
Assistant Examiner — Everen Seven
(74) Attorney, Agent, or Firm — Murphy, Bilak & Homiller, PLLC

(57) ABSTRACT

An integrated circuit is formed in a semiconductor substrate. The integrated circuit includes a trench formed in a first main surface of the semiconductor substrate. The trench includes a first trench portion and a second trench portion. The first trench portion is connected with the second trench portion. Openings of the first and second trench portions are adjacent to the first main surface. The integrated circuit further includes a trench transistor structure including a gate electrode disposed in the first trench portion, and a trench capacitor structure including a capacitor dielectric and a first capacitor electrode. The capacitor dielectric and the first capacitor electrode are disposed in the second trench portion. The first capacitor electrode includes a layer conformal with a sidewall of the second trench portion.

20 Claims, 10 Drawing Sheets

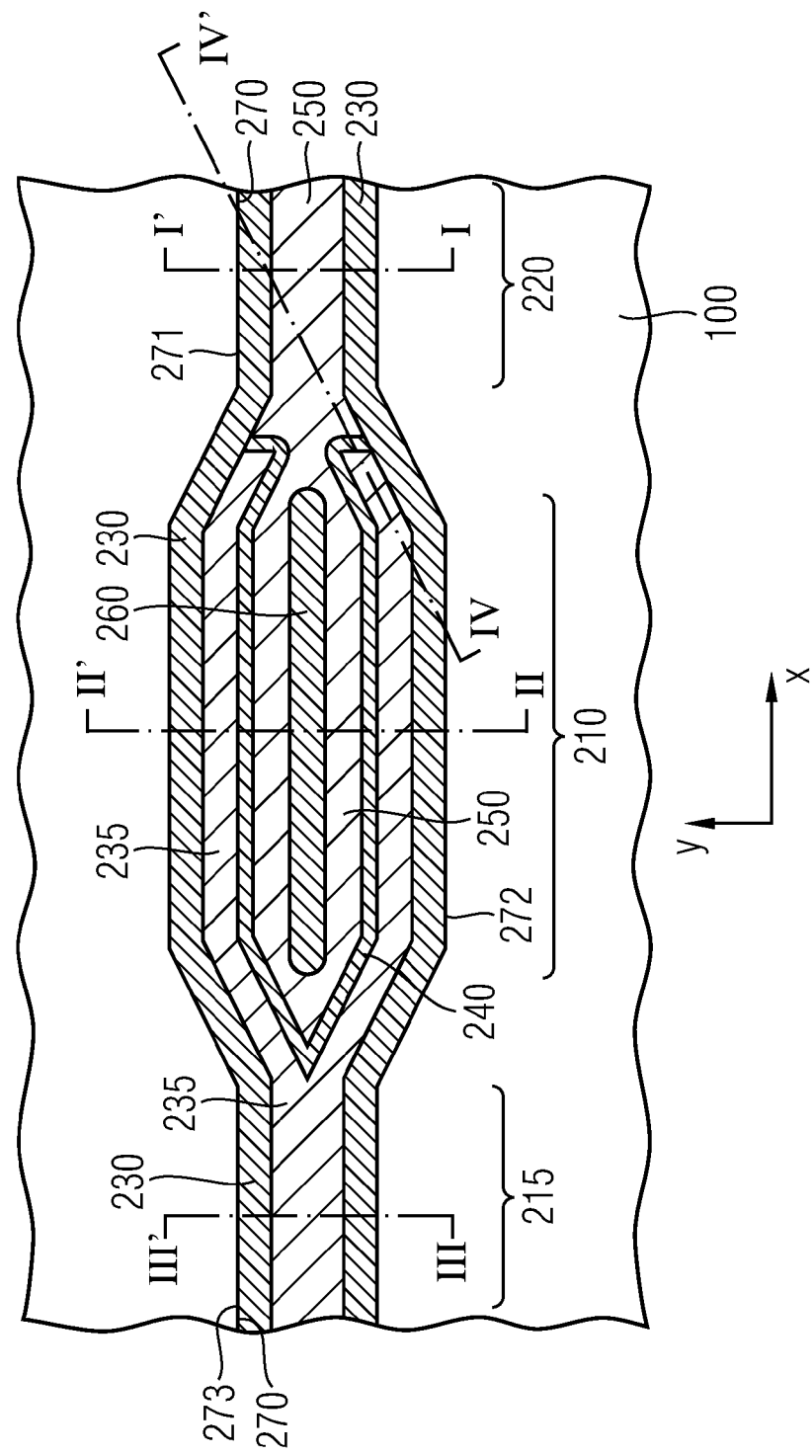

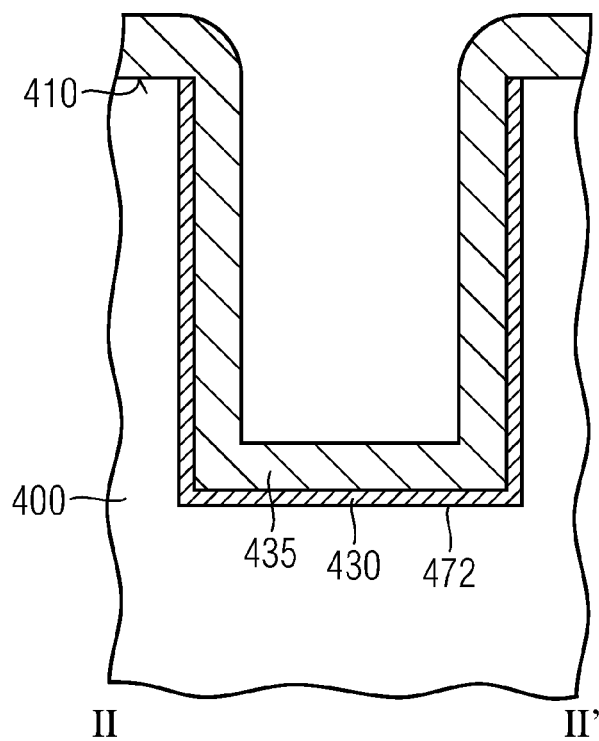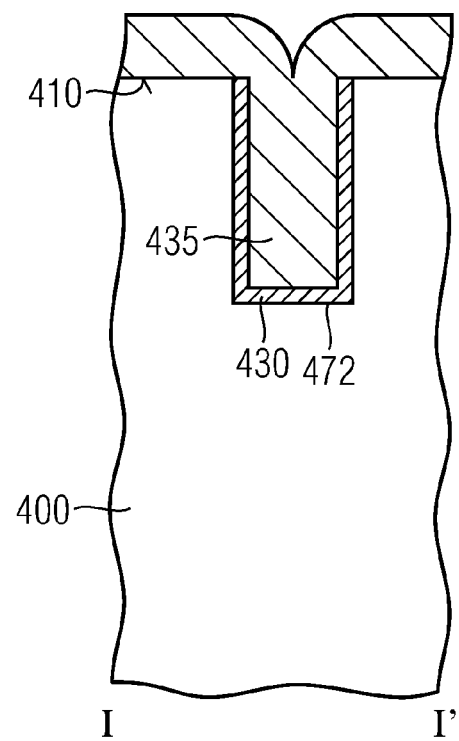

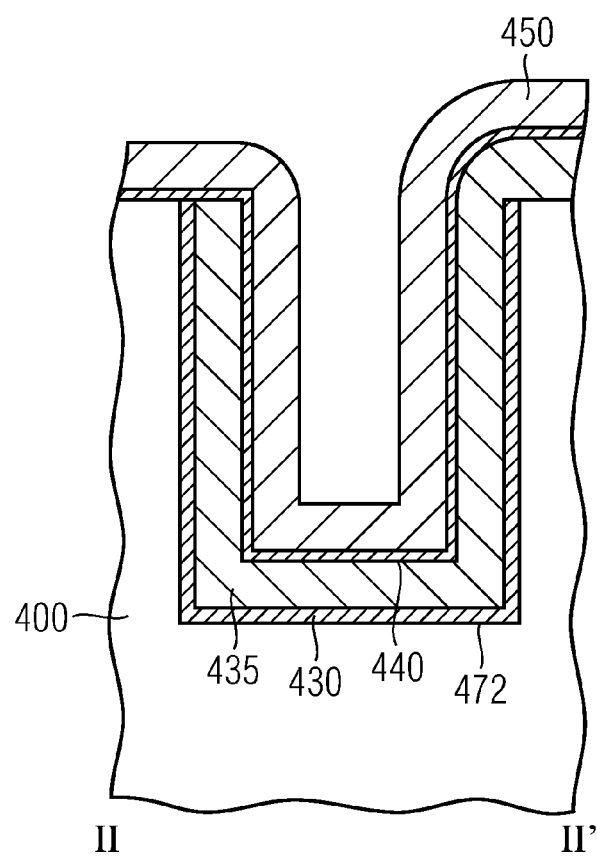
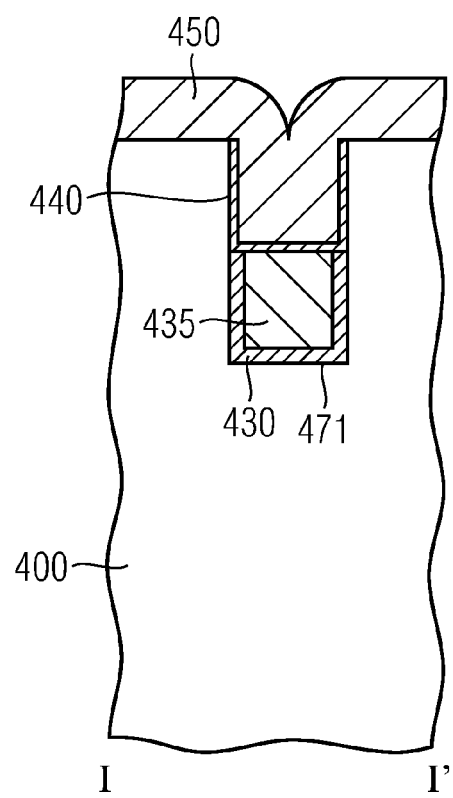

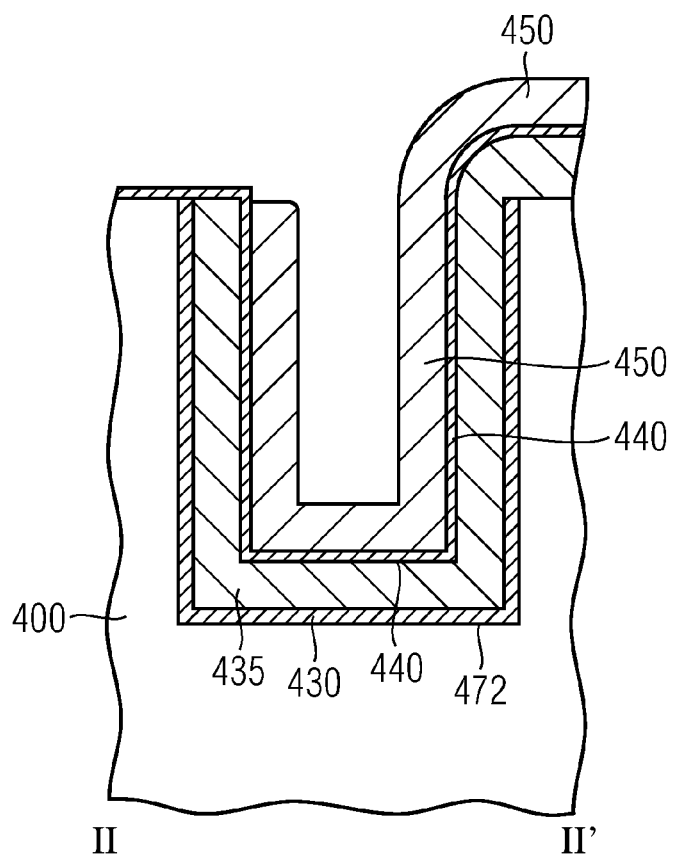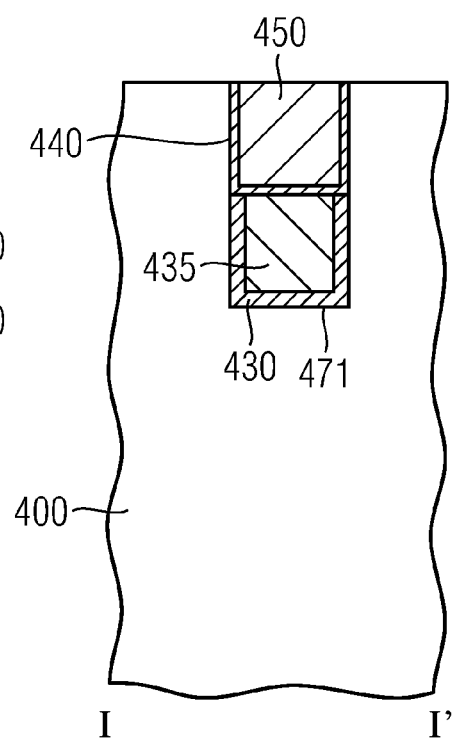

INTEGRATED CIRCUIT AND METHOD OF MANUFACTURING AN INTEGRATED CIRCUIT

BACKGROUND

Integrated circuits including power transistors such as power MOSFETs (Metal Oxide Semiconductor Field Effect Transistors) typically include a cell array of MOSFETs. Some power semiconductor devices also include capacitors having large capacitances.

According to known concepts planar capacitors are arranged on a semiconductor chip. Improved integration schemes of capacitors in a power semiconductor device are desirable.

SUMMARY

According to an embodiment, an integrated circuit in a semiconductor substrate includes a trench in a first main surface of the semiconductor substrate, the trench including a first trench portion and a second trench portion, the first trench portion being connected with the second trench portion in a lateral direction. The integrated circuit further comprises a trench conductive structure comprising a conductive material, the conductive material being disposed in the first trench portion, and a trench capacitor structure comprising a capacitor dielectric and a first capacitor electrode disposed in the second trench portion. The first capacitor electrode comprises a layer lining a sidewall of the second trench portion.

According to an embodiment, a method of manufacturing an integrated circuit in a semiconductor substrate comprises forming a trench in a first main surface of the semiconductor substrate, the trench including a first trench portion and a second trench portion, the first trench portion being connected with the second trench portion in a lateral direction. The method further comprises forming a trench conductive structure including a conductive material in the first trench portion, and forming a trench capacitor structure including a capacitor dielectric and a first capacitor electrode in the second trench portion. The first capacitor electrode includes a layer lining a sidewall of the second trench portion.

According to a further embodiment, a method of manufacturing an integrated circuit in a semiconductor substrate comprises etching a trench in a first main surface of the semiconductor substrate using a mask including a first mask opening portion and a second mask opening portion. The second mask opening portion has a larger width than the first mask opening portion. The method further comprises forming a trench transistor structure including forming a gate electrode in a first trench portion, the first trench portion being defined in the semiconductor substrate beneath the first mask opening portion, and forming a trench capacitor structure including a capacitor dielectric and a first capacitor electrode in a second trench portion. The second trench portion is defined in the semiconductor substrate beneath the second mask opening portion.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1 shows a cross-sectional view of an integrated circuit in a plane parallel to a substrate surface according to an embodiment;

FIGS. 4A and 4B illustrate cross-sectional views of a semiconductor substrate after forming a first polysilicon layer;

FIGS. 6A and 6B illustrate cross-sectional views of the semiconductor substrate after forming the second polysilicon layer;

FIGS. 7A and 7B illustrate cross-sectional views of the semiconductor substrate after etching back the second semiconductor layer;

DETAILED DESCRIPTION

Figure 2A:
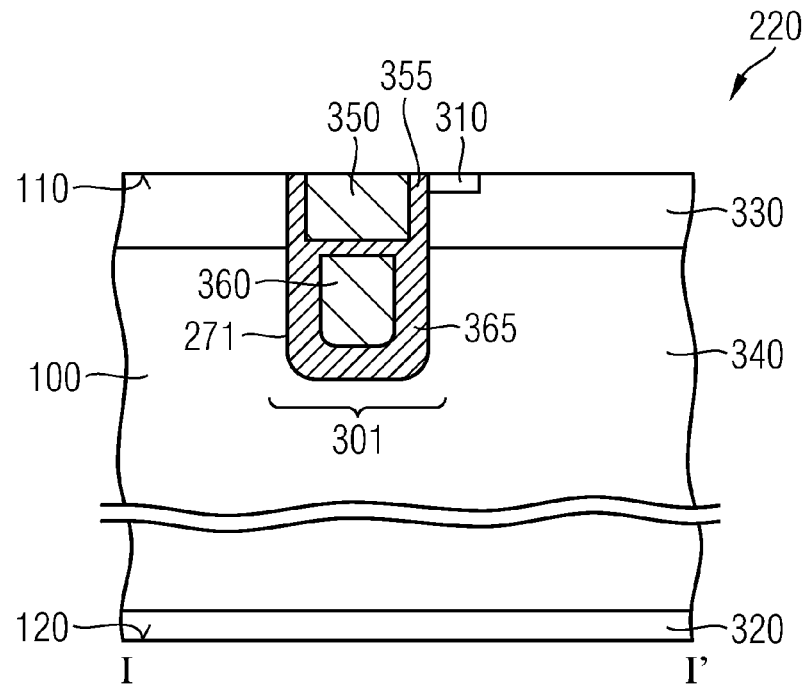
FIG. 2A shows a cross-sectional view taken perpendicularly with respect to the substrate surface of a transistor illustrated in FIG. 1.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The Figures and the description illustrate relative doping concentrations by indicating "−" or "+" next to the doping type "n" or "p". For example, "n⁻" means a doping concentration which is lower than the doping concentration of an "n"-doping region while an "n⁺"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, MOSFETs may be re-channel or p-channel MOSFETs. For example, in an n-channel MOSFET, the source and the drain region are doped with n-type dopants, and the current direction is from the drain region to the source region. In a p-channel MOSFET, the source and the drain region are doped with p-type dopants, and the current direction is from the source region to the drain region. As is to be clearly understood, within the context of the present specification, the doping types may be reversed. If a specific current path is described using directional language, this description is to be merely understood to indicate the path and not the polarity of the current flow, i.e. whether the transistor is a p-channel or an n-channel transistor. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

Generally, for patterning material layers, a photolithographic method may be used in which a suitable photoresist material is provided. The photoresist material is photolithographically patterned using a suitable photomask. The patterned photoresist layer can be used as a mask during subsequent processing steps. For example, as is common, a hardmask layer or a layer made of a suitable material such as silicon nitride, polysilicon or carbon may be provided over the material layer to be patterned. The hardmask layer is photolithographically patterned using an etching process, for example. Taking the patterned hardmask layer as an etching mask, the material layer is patterned.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

FIG. 1 shows a cross-sectional view that is taken parallel to a first main surface of a semiconductor substrate 100, of an integrated circuit 200 according to an embodiment. The integrated circuit comprises a trench 270 that is formed in a first main surface of the semiconductor substrate 100. The trench 270 includes a first trench portion 271 and a second trench portion 272. The first trench portion 271 is connected with the second trench portion 272 in a lateral direction. For example, the openings of the first and second trench portions 271, 272 are adjacent to the first main surface. As will be explained in the following, the integrated circuit 200 further includes a trench conductive structure 215, 220 comprising a conductive material 250, the conductive material 250 being disposed in the first trench portion 271, 273. The integrated circuit 200 further includes a trench capacitor structure 210 comprising a capacitor dielectric 240 and a first capacitor electrode 235, the capacitor dielectric 240 and the first capacitor electrode 235 being disposed in the second trench portion 272. The first capacitor electrode 235 comprises a layer lining or being conformal with a sidewall of the second trench portion 272. According to an embodiment, the trench conductive structure may implement a connection portion 215 an example of which is also illustrated in FIG. 2D. According to a further embodiment, the trench conductive structure may implement a transistor portion 220, an example of which is illustrated in FIG. 2A.

The cross-sectional view of FIG. 1 shows a transistor portion 220, a capacitor portion 210 and a connection portion 215. The integrated circuit 200 comprises the transistor portion 220 disposed in the first trench portion 271. The transistor portion 220 comprises a trench transistor structure which is, for example, illustrated in FIG. 2A. The integrated circuit 200 further comprises the capacitor portion 210 disposed in the second trench portion 272. The capacitor portion 210 comprises a trench capacitor structure which is, for example, illustrated in FIG. 2B or 2C. Moreover, the integrated circuit 200 may comprise the connection portion 215 disposed in a third trench portion 273. The connection portion 215 comprises a trench connection structure which is, for example, illustrated in FIG. 2D.

As is illustrated in FIG. 1, the first, second and third trench portions 271, 272, 273 may be connected with each other. They extend along respective extension directions, for example, along a first direction (x direction). The first trench portion 271 has a smaller width than the second trench portion 272. Further, the third trench portion 273 has a smaller width than the second trench portion 272. For example, the width of the third trench portion 273 may be equal to the width of the first trench portion 271. The width of the trench portions is measured along a direction which is perpendicular with respect to the trench extension direction. For example, the width of the trench portions 271, 272, 273 may be measured along a second direction (y direction). According to a further embodiment, any of the first, second and third trench portions 271, 272, 273 may be separate from other trench portions.

A layer stack comprising conductive and insulating materials is disposed within each of the first to third trench portions 271, 272, 273. For example, a first insulating layer 230 such as silicon oxide or any other suitable material may be disposed on the sidewalls of the trench 270, the first insulating layer 230 being adjacent to the substrate material 100. In the capacitor portion 210, a first insulating layer 230, followed by a first conductive layer 235 such as polysilicon may be disposed at the sidewalls of the second trench portion 272. For example, within the connection portion 215 the first conductive layer 235 may be a filling. Further, a second insulating layer 240 may be disposed on sidewalls in the second trench portion 272, adjacent to the first conductive layer 235. Moreover, a conductive layer or conductive filling comprising the second conductive layer 250 may be disposed within the second trench portion 272. Further, the second conductive layer 250 may be a conductive filling in the first trench portion 271. The conductive material 250 in the first trench portion 271 may be connected with the conductive material 250 in the second trench portion 272. Alternatively, the conductive material 250 in the first trench portion 271 may be insulated from the conductive material 250 in the second trench portion 272. The conductive material 235 in the third trench portion 273 may be connected with the conductive material 235 in the second trench portion 272. Alternatively, the conductive material 235 in the third trench portion 273 may be insulated from the conductive material 235 in the second trench portion 272.

FIG. 2A illustrates a cross-sectional view between I and I' of the transistor portion 220 illustrated in FIG. 1. FIG. 2A illustrates a trench transistor structure 301 of the transistor portion 220 in more detail. A first trench portion 271 is formed in a first main surface 110 of a semiconductor substrate 100. A field plate 360 is disposed in a lower portion of the first trench 271. A gate electrode 350 is disposed in an upper portion of the first trench portion 271. The gate electrode 350 is insulated from adjacent semiconductor material by means of a gate dielectric 355 which may be made of a suitable insulating material such as silicon oxide. The field plate 360 is insulated from adjacent semiconductor material by means of a field dielectric layer 365 such as silicon oxide, for example. A source region 310 is disposed adjacent to the first main surface 110 of the semiconductor substrate 100. Further, a body region 330 is disposed adjacent to the gate electrode 350 and insulated from the gate electrode 350 by means of the gate dielectric layer 355. A drain region 320 is disposed adjacent to a second main surface 120 of the semiconductor substrate. A drift region 340 is disposed between the body region 330 and the drain region 320. According to an embodiment, the source region 310 and the drain region 320 may be doped with a first conductivity type, and the body region 330 may be doped with a second conductivity type. The drift region 340 may be doped with the first conductivity type, at a lower doping concentration than the drain region 320. The illustrated specific arrangement of the source region 310 and the body region 320 is only given by way of example. As is to be clearly understood, the arrangement of the source region 310, drain region 320, body region 330, and drift region 340 may be arbitrary and according to commonly known concepts.

When the transistor formed in the trench transistor structure 301 is switched on, a conductive inversion layer is formed at the boundary between the body region 330 and the gate dielectric 355. Accordingly, the transistor is in a conducting state from the source region 310 to the drain region 320 via the drift zone 340. In case of switching-off, no conductive channel is formed, and the carriers within the drift region 340 are compensated by the field plate 360. As a consequence, the drift region 340 may be depleted, resulting in a blocking of the current flow at a high breakdown voltage. This mechanism is described only by way of example. As is generally known, the trench transistor structure 301 may implement any other kind of transistor, for example, including an IGBT according to which a further electrode of the second conductivity type is disposed adjacent to the second main surface 120 of the semiconductor substrate 100.

Figure 2B:
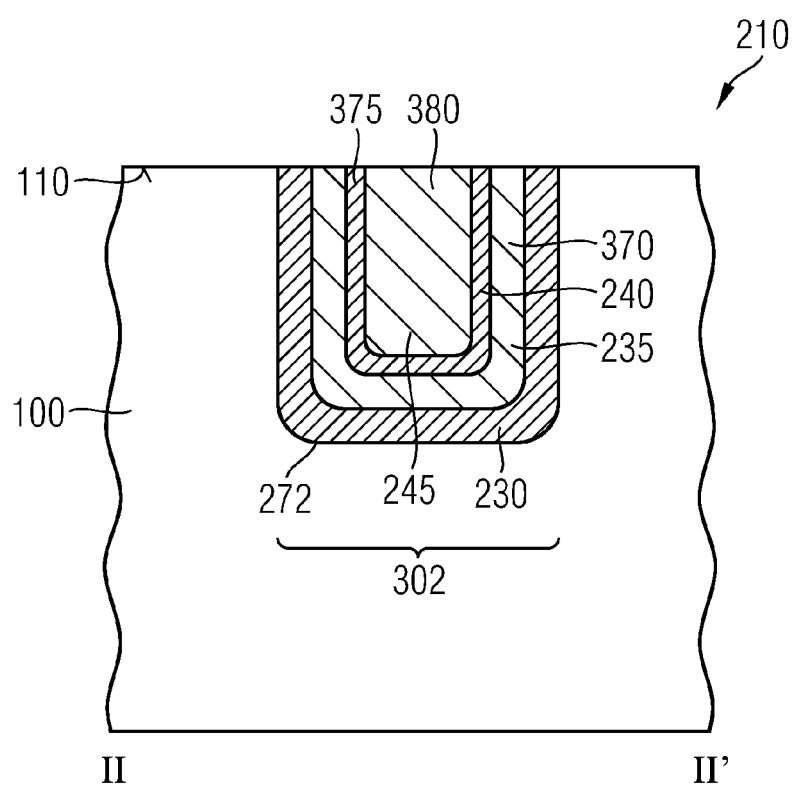
FIG. 2B illustrates an example of a cross-sectional view of a capacitor region of the integrated circuit of FIG. 1.

FIG. 2B illustrates a cross-sectional view of the capacitor portion 210 between II and II' of FIG. 1. In the cross-sectional view of FIG. 2B, the first insulating layer 230 is formed as a conformal layer in a similar manner as the field dielectric layer 365 in FIG. 2A. Differing from the trench transistor structure 301, the first conductive layer 235 is formed as a conformal layer so as to form a first capacitor electrode. Differently stated, the first conductive layer 235 lines the sidewalls of the second trench portion 272. Moreover, the second insulating layer 240 is disposed over the entire surface of the first conductive layer 235 to form a layer, that is conformal with or lines the second trench portion 372. The second conductive layer 245 forms a conductive filling of the second trench portion 272 and forms the second capacitor electrode 380.

Figure 2C:
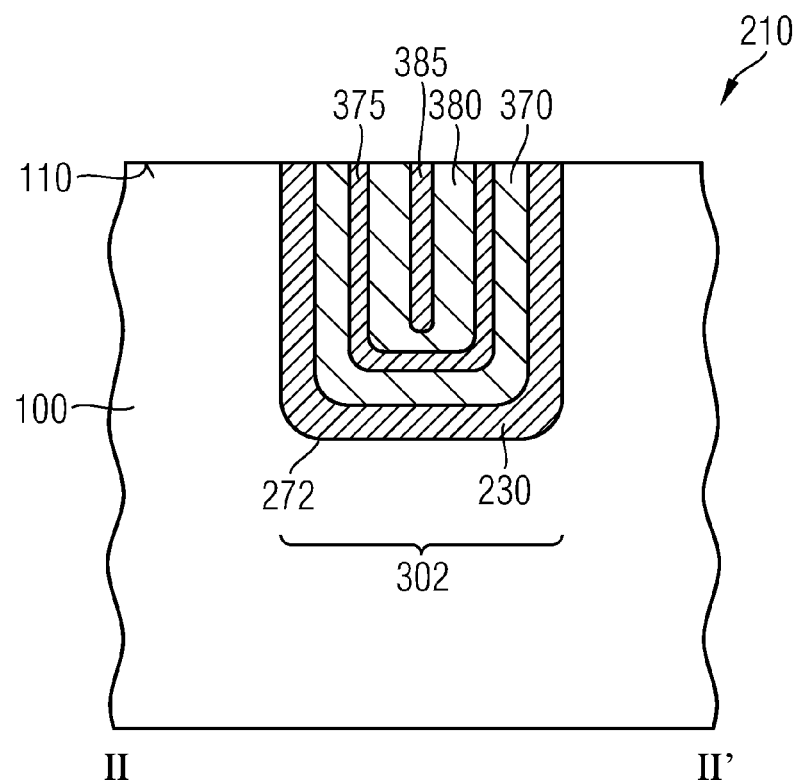
FIG. 2C shows a further example of a cross-sectional view of the capacitor region of the integrated circuit illustrated in FIG. 1.
Figure 2D:
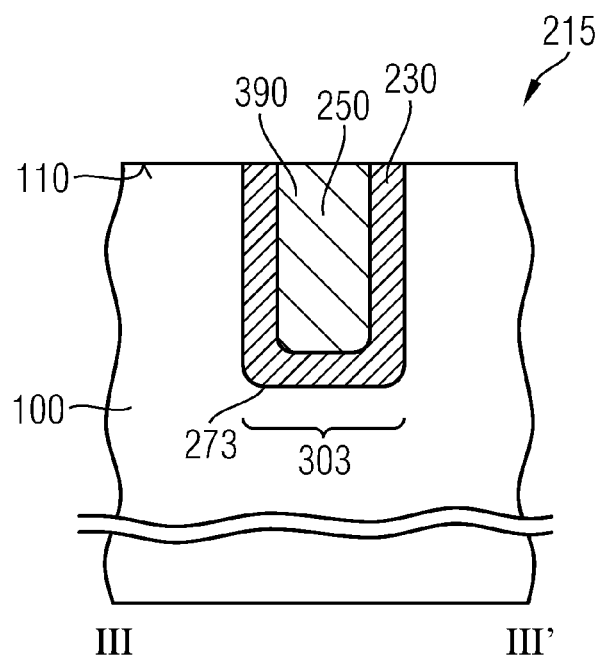
FIG. 2D illustrates a cross-section view of a connection portion of the integrated circuit illustrated in FIG. 1.

According to the embodiment of FIG. 2C, which shows the same elements as FIG. 2B, the second conductive layer 380 may also be formed as a conformal layer and a further insulating filling 385 may be formed so as to fill the second trench portion 272. According to the embodiment of FIG. 2C, further conductive and insulating layers may be disposed within the second trench portion 272, depending on the dimensions of the second trench portion and the thickness of the respective layers. As a result, a capacitor structure 302 including a plurality of electrodes or having a large effective electrode area may be provided.

According to the embodiment of FIGS. 2B and 2C, the capacitor electrodes 370, 380 are implemented by conductive layers 235, 245. Nevertheless, as is to be clearly understood, any of the capacitor electrodes may be implemented by doped substrate portions, for example, adjacent to the first insulating layer 230.

FIG. 2D shows a cross-sectional view of the connection portion 215 between III and III' of FIG. 1. FIG. 2D illustrates the trench connection structure 303 in more detail. According to the embodiment of FIG. 2D, a third trench portion 273 is formed in the first main surface 110 of the semiconductor substrate 100. A first insulating layer 230 is conformally formed and disposed adjacent to the sidewalls of the third trench portion 273. Moreover, the second conductive layer 250 forms a conductive filling and implements the connection line 390.

Figure 2E:
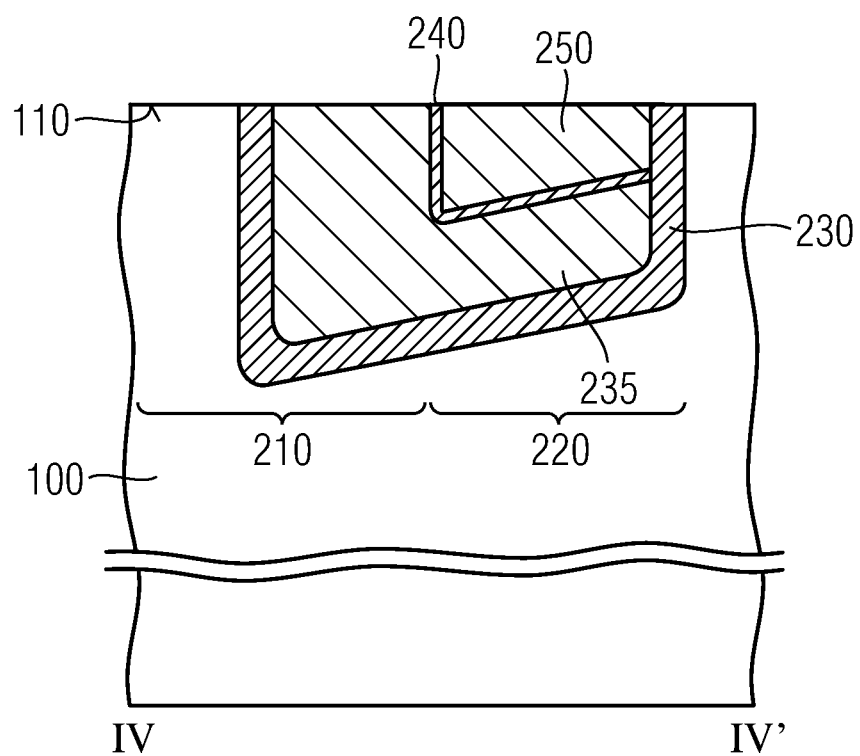
FIG. 2E illustrates a cross-sectional view in a direction slanted with respect to the directions of the cross-sectional views illustrated in FIGS. 2A to 2D.

FIG. 2E shows a cross-sectional view between IV and IV' of FIG. 1, the cross-sectional view intersecting the capacitor portion 210 and the transistor portion 220. As is illustrated, the bottom side of the trench is disposed at a greater depth measured from the first main surface 110 of the semiconductor substrate 100 than the trench portion in the transistor portion 220. With increasing width of the second trench portion 272, the conductive layer 235 is rather deposited as a layer lining the sidewalls of the second trench portion 272 than as a filling.

Figure 3A:
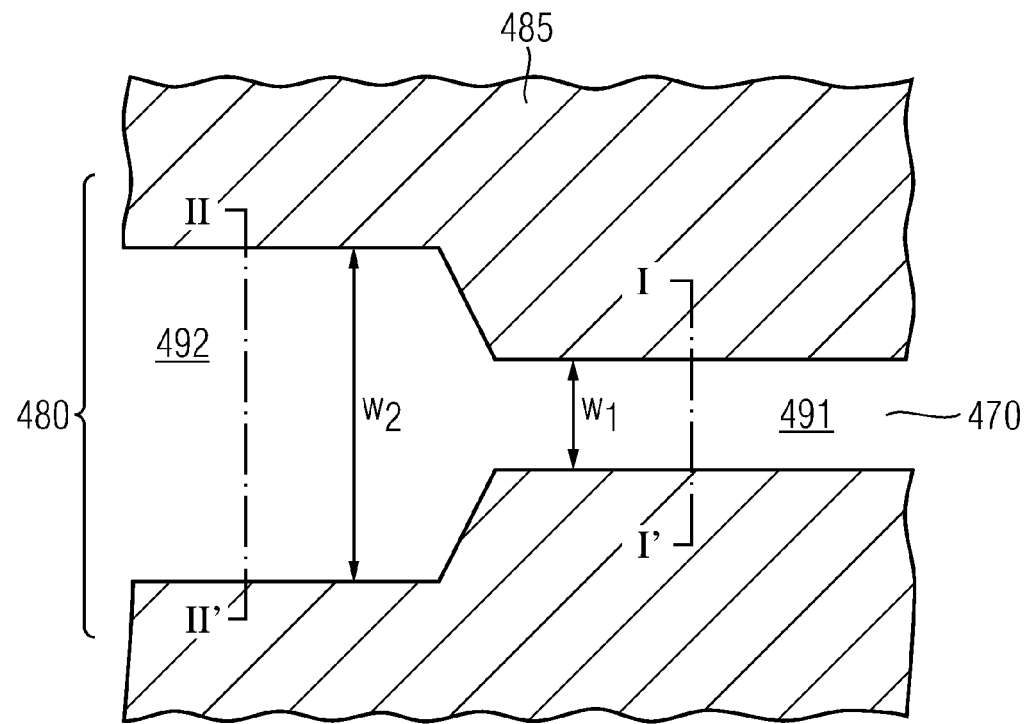
FIG. 3A illustrates an example of a mask for defining various trench portions.

FIGS. 3A to 7B illustrate elements of a method of manufacturing an integrated circuit according to an embodiment. The method of manufacturing an integrated circuit comprises etching a trench 470 in a first main surface 410 of a semiconductor substrate 400, wherein etching the trench is accomplished using an etching mask 480 which is, for example illustrated in FIG. 3A. The etching mask 480 comprises covering portions 485 and opening portions which leave portions of the first main surface 410 of the semiconductor substrate 400 uncovered. As is illustrated in FIG. 3A, the opening portions comprise a first opening portion 491 having a width $w_1$ and a second opening portion 492 having a width $w_2$. As will be readily appreciated by the person skilled in the art, the first and the second opening portions 491, 492 need not be connected with each other. Using the mask 480 illustrated in FIG. 3A as an etching mask, a photolithographic process may be employed for patterning a photoresist material to form a corresponding photoresist mask. Optionally, a hardmask may be correspondingly patterned as is conventional. An anisotropic etching step may be performed so as to etch semiconductor material. Due to the increased width $w_2$ of the second opening portions 492, the etching depth is increased in this portion corresponding to the portions corresponding to the first opening portion 491 having the smaller width $w_1$. For example, plasma etching using, for example, $CF_4$ or $HBr_2$ as an etching gas may be performed.

Figure 3B:
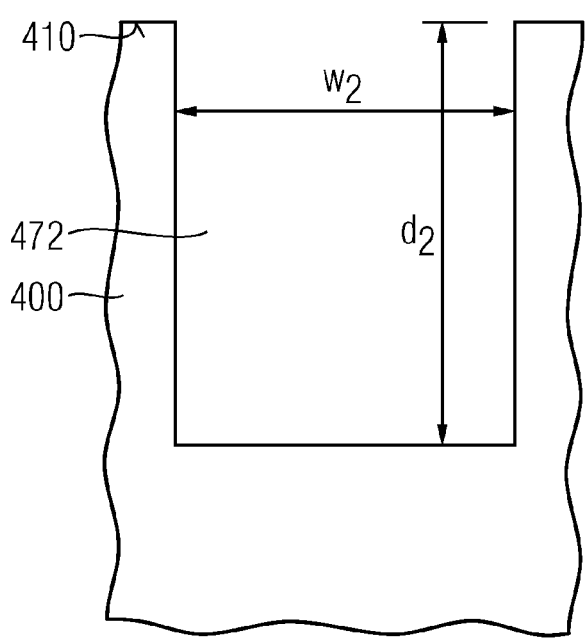
FIGS. 3B and 3C illustrate cross-sectional views of a semiconductor substrate when performing the method according to an embodiment.
Figure 3C:
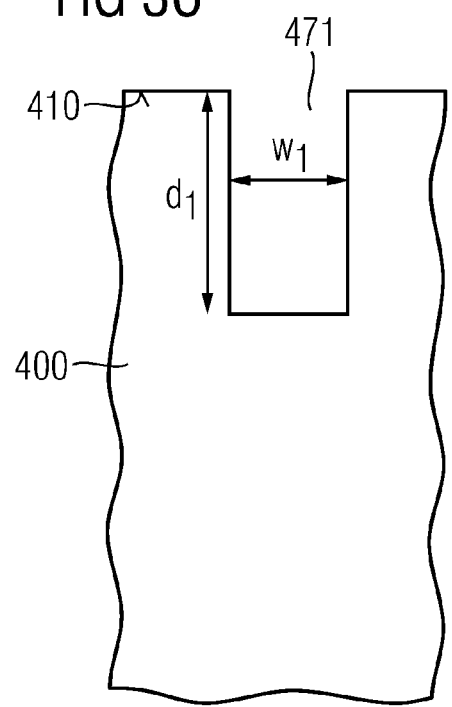

FIG. 3B shows an example of a resulting cross-sectional view between II and II' of FIG. 3A corresponding to the second opening portion 492. As is shown, the second trench portion 472 formed during this etching process has a width $w_2$ and a depth $d_2$. FIG. 3C shows a cross-sectional view between I and I' of FIG. 3A of the first trench portion 471 corresponding to the first opening portion 491. The first trench portion 471 has a width $w_1$ and a depth $d_1$, wherein the width $w_1$ is smaller than the width $w_2$ and the depth $d_1$ is smaller than the depth $d_2$.

Thereafter, a first insulating layer 430 such as silicon oxide is formed so as to cover the walls of the first and second trenches 471, 472, followed by etching back so that the first insulating layer 430 is only present within the first and second trench portions 471, 472. The method of forming the first insulating layer 430 is accomplished by generally known methods and a detailed description thereof will be omitted. Thereafter, the first conductive layer 435 is formed. For example, the first conductive layer 435 may be doped polysilicon as is generally employed. For example, the doped polysilicon may be deposited by a CVD ("chemical vapour deposition") method using in-situ doping. The thickness of the first conductive layer 435 may be chosen in dependence from the first and second widths $w_1$, $w_2$, so that the first conductive layer 435 forms a conformal layer in the second trench portion 472 and forms a filling in the first trench portion 471. For example, a thickness of the first conductive layer 435 may be 100 to 500 nm. During this deposition process, a conformal layer may be formed in the second trench 472. Due to the reduced width of the first trench 471, the first conductive layer forms a filling of the first trench 471.

FIG. 4A shows a cross-sectional view of an example of a resulting structure of the second trench portion 472, and FIG. 4B shows an example of a resulting structure of the first trench portion 471. Thereafter, the first conductive layer 435 is etched back as is conventional. For example, in the trench capacitor structure, a portion of the first conductive layer 435 may remain at a side portion in order to enable a contact. According to a further implementation, a CMP (chemical-mechanical polishing) method may be performed so as to remove the first conductive layer 435 from the substrate surface 410 in the second trench portion 472. Thereafter, a further insulating layer 440 may be formed over the first conductive layer 435. For example, this may be accomplished by a thermal oxidation method or a deposition method using TEOS (tetraethyl orthosilicate) as a starting material. According to a specific embodiment, a further dielectric layer (not illustrated in FIG. 5B) may be formed over the first conductive layer 435 before forming the second dielectric layer 440.

For example, this further dielectric layer may be formed by a method which forms the dielectric layer only on horizontal surfaces while leaving sidewalls of the first trench 471 uncovered.

Figure 5A:
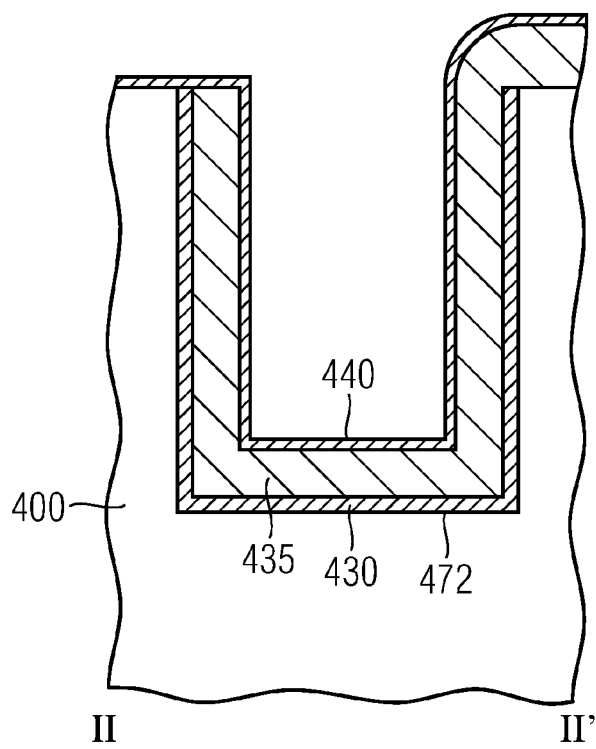
FIGS. 5A and 5B illustrate cross-sectional views of a semiconductor substrate after forming a second dielectric layer.
Figure 5B:
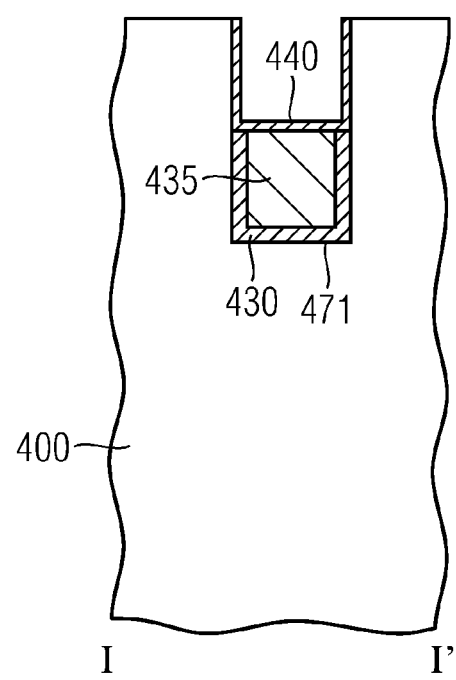

FIG. 5A shows a cross-sectional view of an example of a resulting structure between II and II', and FIG. 5B shows an example of a resulting structure between I and I'. Thereafter, a second conductive layer 450 may be formed. The thickness of the second conductive layer 450 may be chosen so that this layer forms a conformal layer in the second trench portion 472 and forms a filling in the first trench portion 471.

FIG. 6A shows an example of a resulting structure between II and II' of FIG. 3A. Further, FIG. 6B shows an example of a resulting structure between I and I' of FIG. 3A. Thereafter, the second conductive layer 450 may be etched back as is conventional. As a result, as is shown in FIG. 7A, a trench capacitor structure is formed in the second trench 472, the trench capacitor structure comprising a first capacitor electrode made of the first conductive layer 435, a second capacitor electrode made of the second conductive layer 450 as well as a capacitor dielectric made of the second insulating layer 440.

As is shown in FIG. 7B, a trench transistor structure is formed in the first trench 471, the trench transistor structure comprising a field plate made of the first conductive layer 435 and a gate electrode made of the second conductive layer 450. A field dielectric layer made of the first insulating layer 430 is disposed between the field plate 435 and the substrate material 400 and a gate dielectric layer made of the second insulating layer 440 is disposed between the gate electrode 450 and the substrate material 400.

As is generally known, further electrodes or layers of insulating material may be deposited over the second conductive layer 450 shown in FIG. 7A. Further, the thickness of the second conductive layer 450 may be chosen so that the second conductive layer 450 completely fills the remaining portion of the second trench portion 472.

According to a further embodiment, only one insulating layer and only one conductive layer may be formed in the second trench 472. A process of doping the sidewalls of the substrate may be performed in order to form a capacitor electrode. According to this embodiment, a sidewall of the substrate material adjacent to the trench 472 may form a capacitor electrode.

FIGS. 3A to 7B illustrate a method of forming a trench transistor structure and a trench capacitor structure in a semiconductor substrate 400 by using common or joint processing steps. However, it is clearly to be understood, that further elements may be concurrently formed. For example, as is readily apparent to the person skilled in the art, by employing appropriate masking steps, the connection portion 215 may be formed using some of these processing steps. When forming the connection portion 215, a mask having openings of a width similar to the width w1 of the first openings 491 of the etching mask 480 may be employed.

Figure 8:
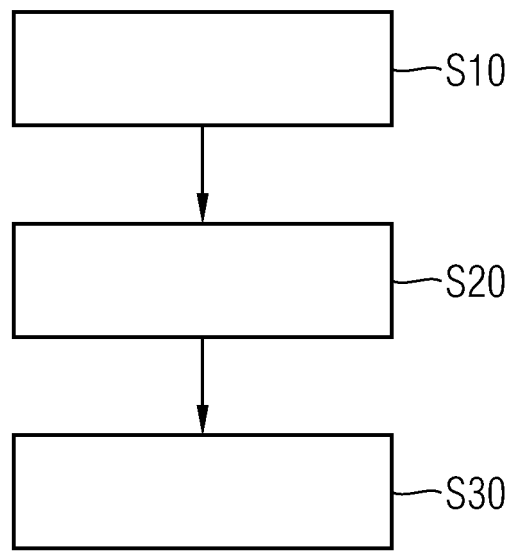
FIG. 8 schematically illustrates a method according to an embodiment.

FIG. 8 illustrates an embodiment of a method of manufacturing an integrated circuit. As is shown, the method of manufacturing an integrated circuit in a semiconductor substrate may comprise: forming a trench in a first main surface of the semiconductor substrate (S10), the trench including a first trench portion and a second trench portion, the first trench portion being connected with the second trench portion in a lateral direction; forming a trench conductive structure (S20) including a conductive material in the first trench portion; and forming a trench capacitor structure (S30) comprising forming a capacitor dielectric and forming a first capacitor electrode in the second trench portion. Forming the first capacitor electrode comprises forming a layer conformal with a sidewall of the second trench portion.

Figure 9:
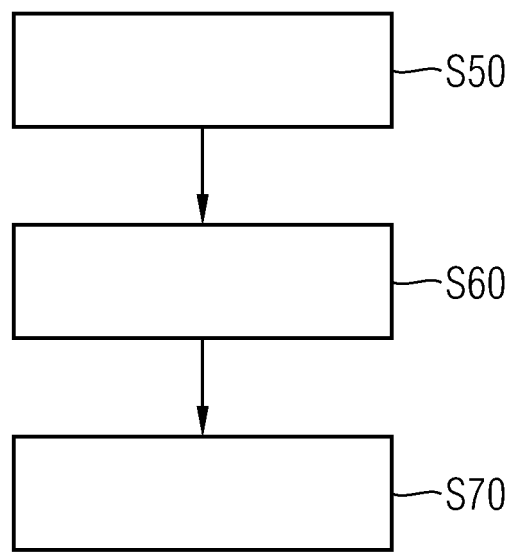
FIG. 9 schematically illustrates a method according to a further embodiment.

FIG. 9 illustrates a further embodiment of a method of manufacturing an integrated circuit. As is illustrated, the method of manufacturing an integrated circuit in a semiconductor substrate comprises: etching a trench (S50) in a first main surface of the semiconductor substrate using a mask including a first mask opening portion and a second mask opening portion, the second mask opening portion having a larger width than the first mask opening portion, the width being measured in a direction perpendicular to an extension direction of the trench; forming a trench transistor structure (S60) comprising forming a gate electrode in a first trench portion, the first trench portion being defined in the semiconductor substrate beneath the first mask opening portion; and forming a trench capacitor structure (S70) comprising forming a capacitor dielectric and forming a first capacitor electrode in a second trench portion, the second trench portion being defined in the semiconductor substrate beneath the second mask opening portion.

As has been explained in the foregoing, by using a specific etching mask comprising a first mask portion and a second mask portion, the first mask portion having a smaller width than the second mask portion, a trench may be formed in a semiconductor substrate. The trench has different widths and different depths in accordance with the different dimensions of the portions of the etching mask. Accordingly, a variety of combinations of conductive and insulating layers may be formed in the second trench portion. As a result, it is possible to form a capacitor having a desired construction in the second trench portion. Thereby, it is possible to integrate the capacitor structure with a semiconductor device on a common substrate, using common processing steps. Since the capacitor is formed in a trench, area may be saved. Further, it is possible to form the capacitor structure and the trench transistor structure by common processing steps. According to an embodiment, the trench capacitor structure may be disposed at an edge area of the semiconductor chip.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. An integrated circuit in a semiconductor substrate, the integrated circuit comprising:
   a trench in a first main surface of the semiconductor substrate, the trench including a first trench portion extending in a first direction and a second trench portion extending in the first direction, the first trench portion being connected with the second trench portion in a lateral direction via a further trench portion extending at an oblique angle with respect to the first direction;
   a trench conductive structure comprising a conductive material, the conductive material being disposed in the first trench portion; and
   a trench capacitor structure comprising a capacitor dielectric and a first capacitor electrode disposed in the second trench portion, the first capacitor electrode comprising a layer lining a sidewall of the second trench portion.

2. The integrated circuit according to claim 1, wherein the second trench portion has a larger width than the first trench portion, the width being measured in a direction perpendicular to the first direction.

3. The integrated circuit according to claim 1, wherein the second trench portion has a larger depth than the first trench portion.

4. The integrated circuit according to claim 1, wherein the trench conductive structure implements a trench transistor structure and the conductive material forms a gate electrode.

5. The integrated circuit according to claim 4, wherein the trench transistor structure further comprises a field plate disposed in a lower portion of the first trench portion beneath the gate electrode.

6. The integrated circuit according to claim 1, wherein the trench capacitor structure further comprises a second capacitor electrode and the capacitor dielectric is disposed between the first and the second capacitor electrodes.

7. The integrated circuit according to claim 5, wherein the trench capacitor structure further comprises a second capacitor electrode and the capacitor dielectric is disposed between the first and the second capacitor electrodes.

8. The integrated circuit according to claim 7, wherein the second capacitor electrode and the field plate comprise the same material.

9. The integrated circuit according to claim 1, wherein the first capacitor electrode and the conductive material comprise the same material.

10. A method of manufacturing an integrated circuit in a semiconductor substrate, the method comprising:
    forming a trench in a first main surface of the semiconductor substrate, the trench including a first trench portion extending in a first direction and a second trench portion extending in the first direction, the first trench portion being connected with the second trench portion in a lateral direction via a further trench portion extending at an oblique angle with respect to the first direction;
    forming a trench conductive structure including a conductive material in the first trench portion; and
    forming a trench capacitor structure including a capacitor dielectric and a first capacitor electrode in the second trench portion, the first capacitor electrode including a layer lining a sidewall of the second trench portion.

11. The method according to claim 10, wherein the first and the second trench portions are formed using an etching mask comprising a first mask opening portion and a second mask opening portion, the first mask opening portion being connected with the second mask opening portion, the second mask opening portion having a larger width than the first mask opening portion.

12. The method according to claim 11, wherein the first trench portion is formed to have a smaller width than the second trench portion, the width being measured perpendicularly with respect to an extension direction of the first and second trench portions, respectively.

13. The method according to claim 12, wherein the first trench portion is formed to have a smaller depth than the second trench portion.

14. The method according to claim 10, wherein the first and second trench portions are formed using joint etching processes.

15. The method according to claim 10, wherein forming the conductive material and forming the first capacitor electrode comprises common processes of forming a conductive layer.

16. The method according to claim 15, wherein a thickness of the conductive layer is selected so that the conductive layer fills the first trench portion.

17. The method according to claim 10, wherein forming the trench conductive structure further comprises forming a field plate disposed in a lower portion of the first trench portion beneath the conductive material, the conductive material forming a gate electrode of a trench transistor structure.

18. The method according to claim 17, wherein forming the trench capacitor structure further comprises forming a second capacitor electrode so that the capacitor dielectric is disposed between the first and the second capacitor electrodes.

19. The method according to claim 18, wherein forming the field plate and forming the second capacitor electrode comprises common processes of forming a conductive layer.

20. A method of manufacturing an integrated circuit in a semiconductor substrate, the method comprising:
  etching a trench in a first main surface of the semiconductor substrate using a mask including a first mask opening portion and a second mask opening portion, the first mask opening portion being connected with the second mask opening portion via a connection portion extending at an oblique angle with respect to a first direction, the second mask opening portion having a larger width than the first mask opening portion, the width being measured perpendicularly with respect to the first direction;
  forming a trench transistor structure including forming a gate electrode in a first trench portion, the first trench portion being defined in the semiconductor substrate beneath the first mask opening portion; and
  forming a trench capacitor structure including a capacitor dielectric and a first capacitor electrode in a second trench portion, the second trench portion being defined in the semiconductor substrate beneath the second mask opening portion.

* * * * *